United States Patent [19]

Tahmassebpur

[11] Patent Number: 5,748,449
[45] Date of Patent: May 5, 1998

[54] ELECTRICAL ENCLOSURE FOR RADIO

[75] Inventor: Mohammed Tahmassebpur, Vancouver, Canada

[73] Assignee: Sierra Wireless, Inc., Richmond, Canada

[21] Appl. No.: 425,744

[22] Filed: Apr. 20, 1995

[51] Int. Cl.⁶ .................. H05K 5/04; H05K 9/00
[52] U.S. Cl. .............. 361/753; 361/800; 361/816; 361/818; 174/35 R; 174/35 GC; 174/65 R; 439/76.1; 334/85
[58] Field of Search .................. 361/753, 799, 361/800, 816, 818; 174/35 R, 35 GC, 64, 65 R; 334/85; 333/12; 330/68; 439/607, 63, 74, 76.1, 929

[56] References Cited

U.S. PATENT DOCUMENTS

| | | | |
|---|---|---|---|
| 2,667,368 | 1/1954 | Ferguson | 174/65 R |
| 4,823,235 | 4/1989 | Suzuki et al. | 361/816 |
| 5,352,854 | 10/1994 | Comerci et al. | 174/65 R |
| 5,354,951 | 10/1994 | Lange, Sr. et al. | 174/35 R |
| 5,420,760 | 5/1995 | Ansell et al. | 361/818 |

FOREIGN PATENT DOCUMENTS

| | | | |
|---|---|---|---|
| 2 339 978 | 8/1977 | France | H02G 3/08 |
| 3335664 A1 | 4/1985 | Germany | 174/35 R |
| 85 03 957.8 | 2/1987 | Germany | H05K 7/14 |
| 36 42 151 | 6/1988 | Germany | H05K 9/00 |
| 90 04 686.2 | 8/1990 | Germany | H05K 9/00 |
| 5-95196 | 4/1993 | Japan | 361/816 |
| 2 152 291 | 7/1985 | United Kingdom | H05K 9/00 |

Primary Examiner—Leo P. Picard
Assistant Examiner—John B. Vigushin
Attorney, Agent, or Firm—Burns, Doane, Swecker & Mathis, LLP

[57] ABSTRACT

An electrical enclosure for a circuit board includes a top part and a bottom part. Substantially rigid compression fingers extend downwardly from a top wall of the top part and are disposed inwardly from a top side wall of the top part. One or more shield springs extend upwardly from a bottom wall of the bottom part and are disposed inwardly from a bottom side wall of the bottom part. The top part and the bottom part are attachable and detachable such that the top and bottom shells define a chamber, the compression fingers and the shield springs contacting top and bottom surfaces of the circuit board, respectively, to thereby suspend the circuit board in the chamber. A coaxial cable grounding arrangement and an electrical connector shielding arrangement are also disclosed.

26 Claims, 4 Drawing Sheets

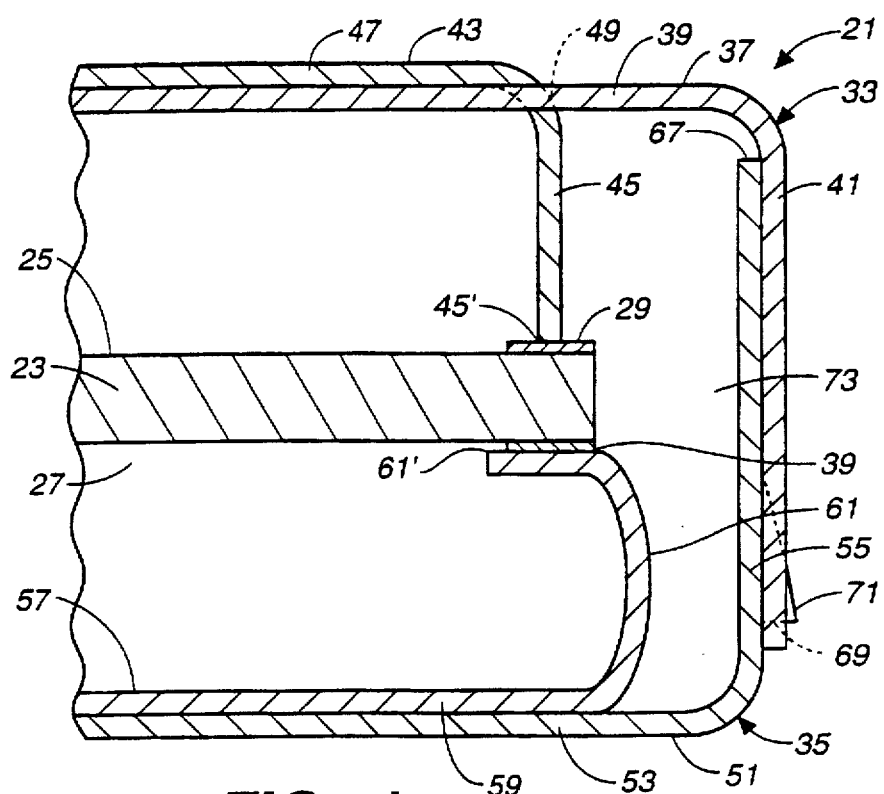
FIG._1
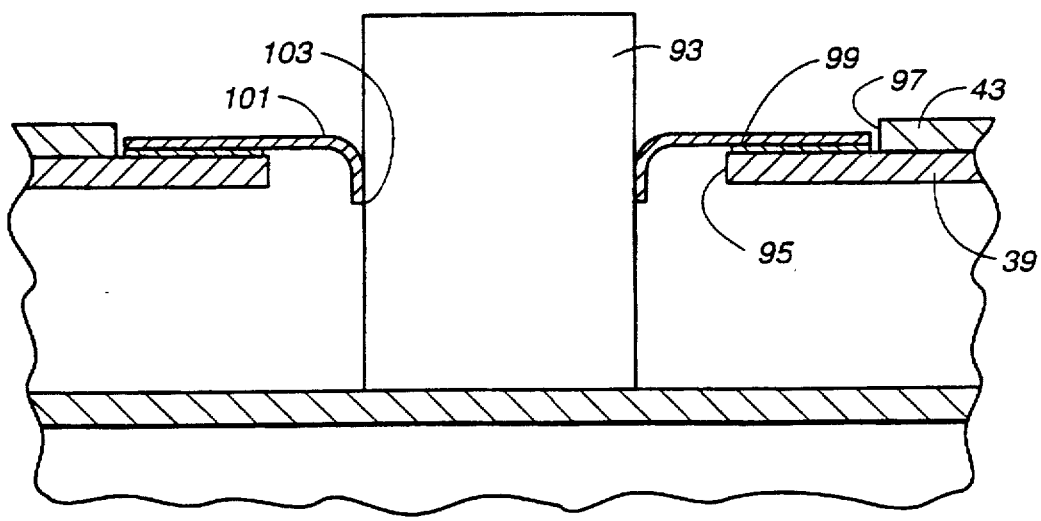
FIG._7

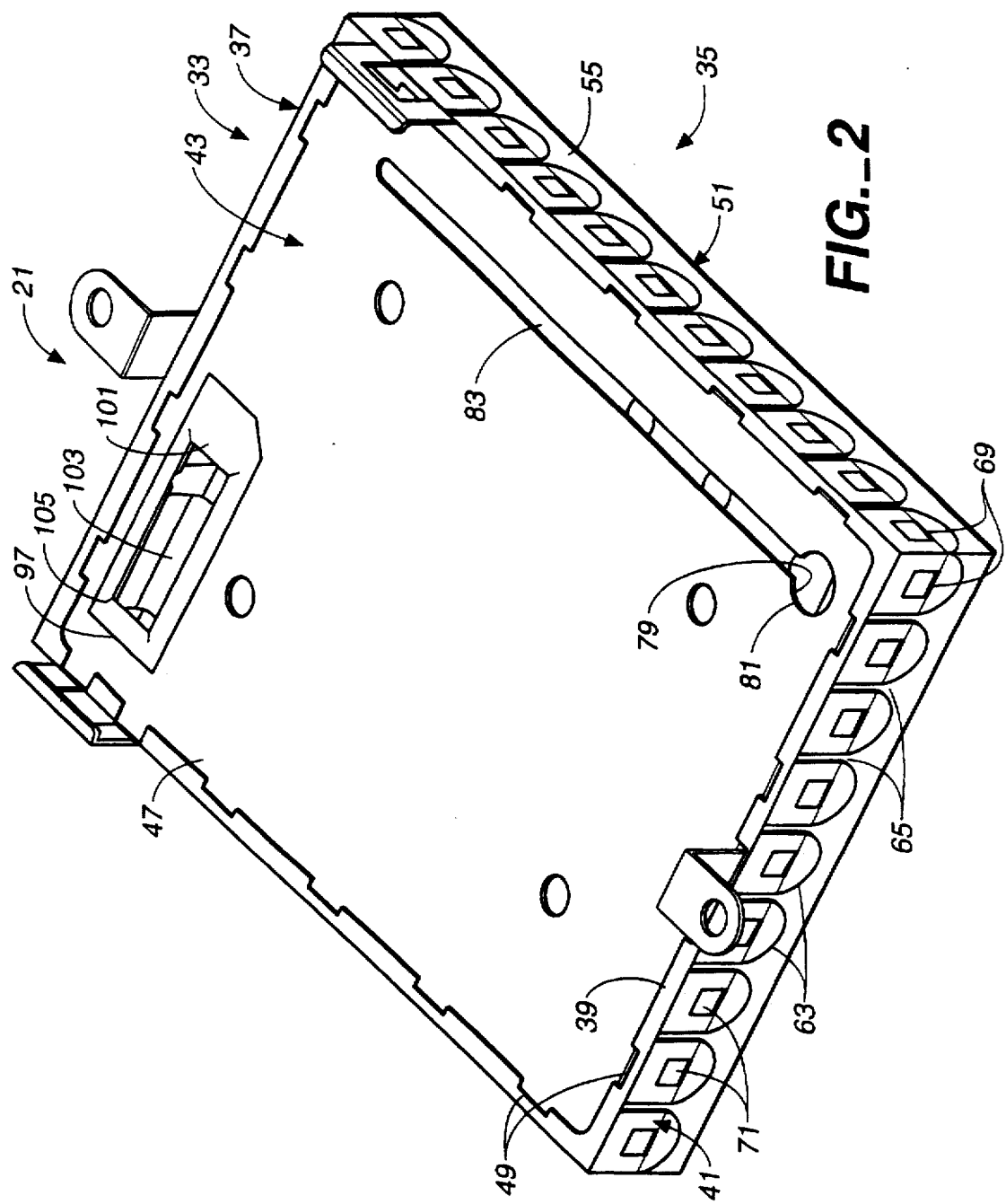
FIG._2

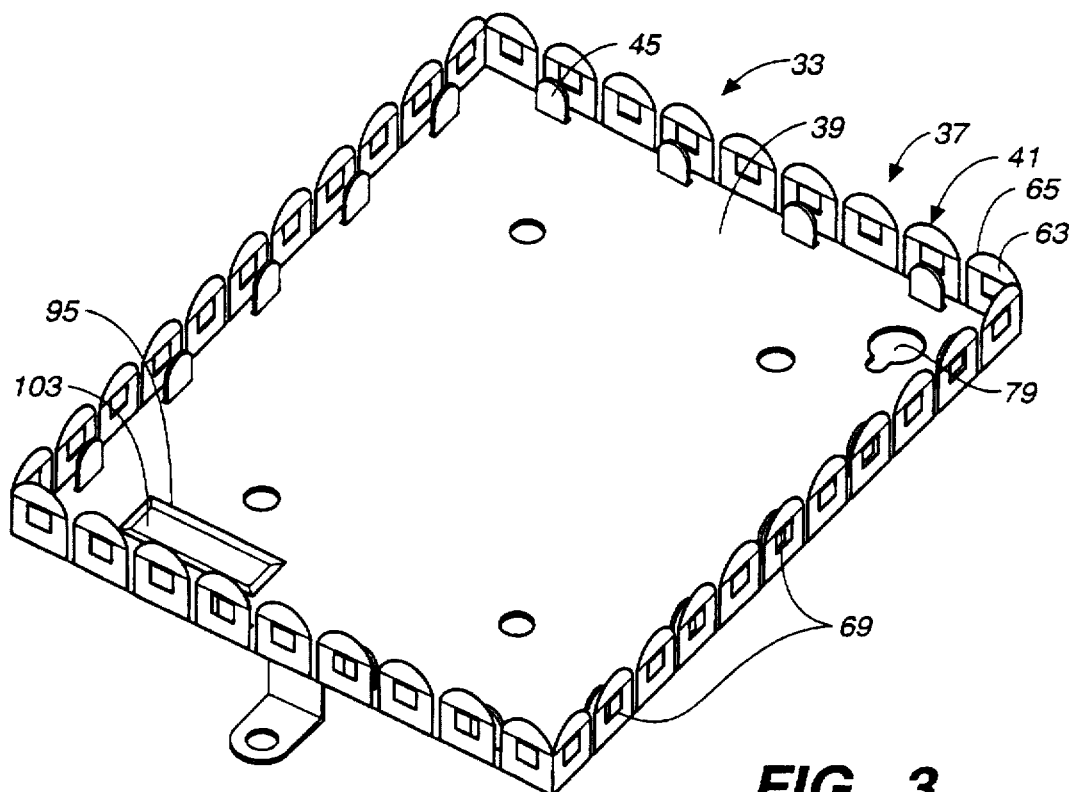
FIG._3
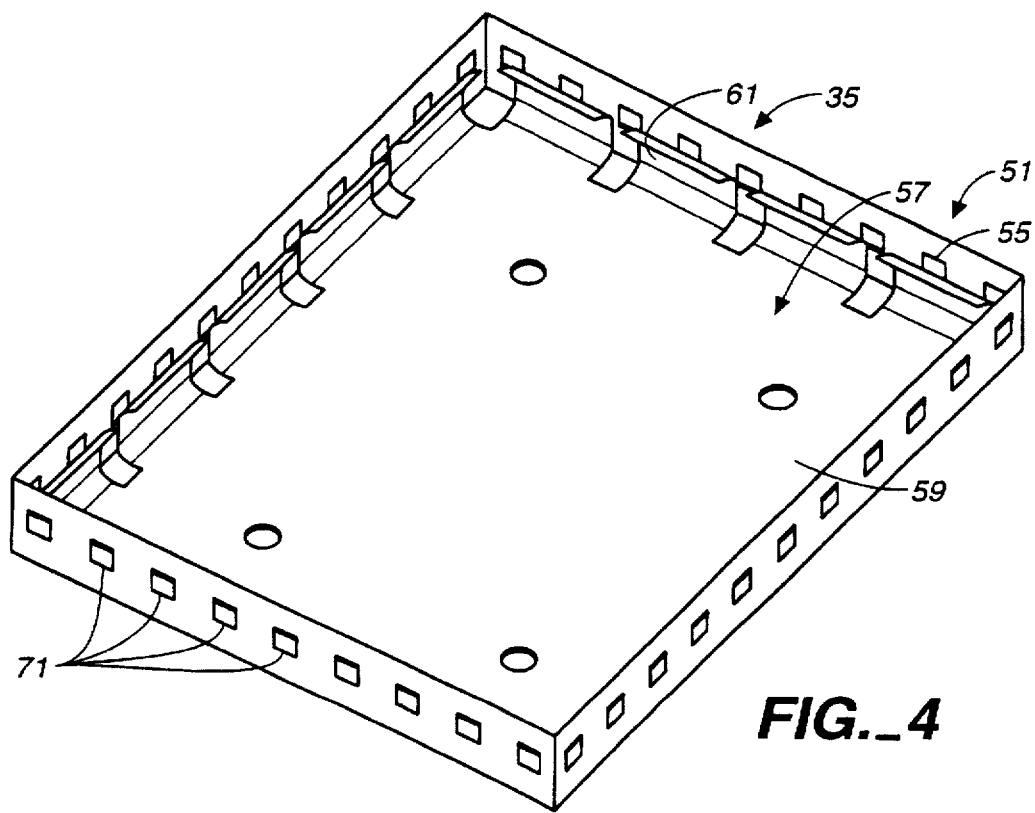
FIG._4

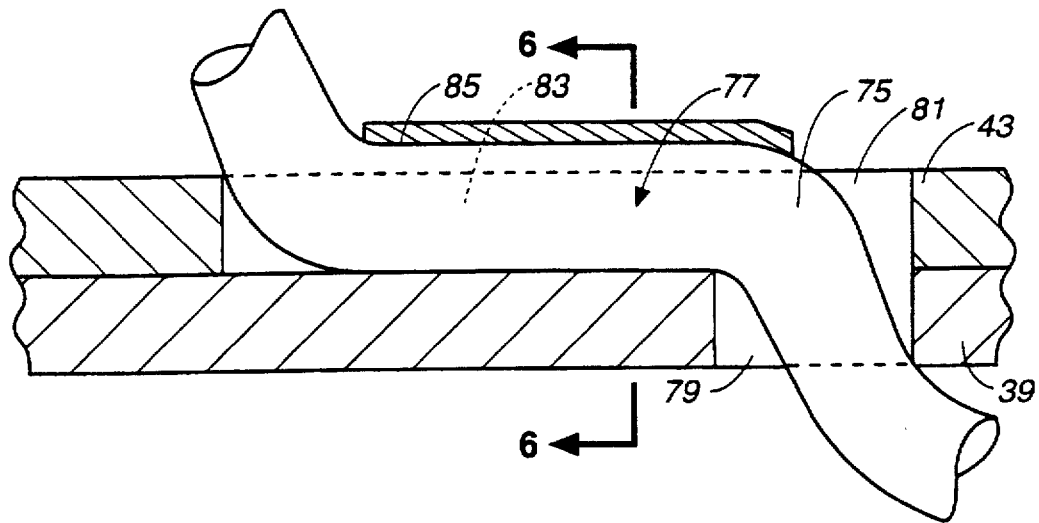
FIG._5
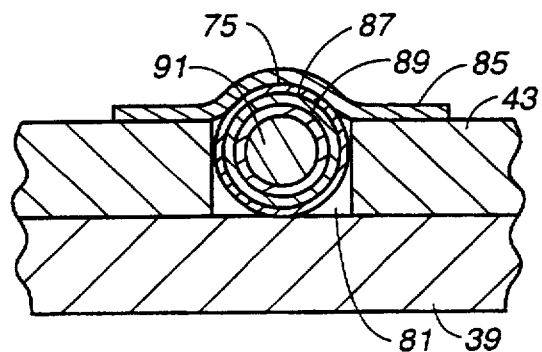
FIG._6

ELECTRICAL ENCLOSURE FOR RADIO

BACKGROUND OF THE INVENTION

1. Field of the Invention

The present invention relates to electrical enclosures and, more particularly, to electrical enclosures in which components of an electrical apparatus are grounded and/or shielded by the enclosure.

2. State of the Art

It is well known to use printed circuit boards (PCBs) for mounting electrical equipment in electrical apparatuses such as radios. The printed circuit boards often have digital and analog components mounted thereon. To avoid adverse effects of electromagnetic interference (EMI), it is customary to shield the components. For example, digital components may be isolated from analog components in separate chambers by walls formed of conductive material or having conductive coatings thereon for absorbing EMI. Openings such as doors and the like are typically gasketed with flexible conductive strips to minimize leakage of EMI. Smaller openings, such as those used for introducing electrical connectors or coaxial cables present greater problems as conventional techniques for sealing these openings tend to provide poor fits and permit potentially harmful leakage of EMI. It is, accordingly, desirable to provide an electrical enclosure that permits introduction of members such as electrical connectors and coaxial cables into the electrical enclosure while, at the same time, minimizing leakage of EMI from or introduction of EMI into the enclosure.

Coaxial cables, such as radio antennas, present further difficulties. Ordinarily, coaxial cables include an inner conductor, a dielectric around the inner conductor, a coaxial shield around the dielectric, and a jacket, or outer insulator, around the coaxial shield. Noise tends to run along the surface of such cables, resulting in a so-called "skin effect". It is necessary to eliminate this noise to prevent it from going directly into the electrical enclosure and affecting the electrical equipment therein.

It is customary to attempt to eliminate the noise or skin effect by grounding the cable shielding directly to a conductive electrical enclosure, usually by removing the jacket around the cable shielding outside of the enclosure and soldering the cable shielding directly to the conductive enclosure. Inside the electrical enclosure, the cable shielding and the dielectric are removed and the conductor is soldered to the PCB. One drawback of this technique is that, by removing the outer jacket and soldering the cable shielding to the enclosure, the dielectric may be inadvertently melted and the conductor may be shorted out. In addition, assembly and disassembly of electrical equipment is hampered by the need to form or remove numerous soldered connections. It is, accordingly, desirable to provide an electrical enclosure that eliminates a skin effect on a coaxial cable without the need for soldering.

It is also typical to ground electrical components in the electrical enclosures by forming a soldered connection between the component and the conductive enclosure. In manufacturing electrical equipment including, e.g., one or more PCBs, it is typical to perform assembly in a so-called "top down" manner. In top down assemblies, it is desirable to first provide all of the necessary connections, including soldered grounding connections, for a first layer of the assembly, followed by providing all of the necessary connections for second and further layers in a layer by layer manner. Where numerous soldered grounding connections must be made, it is time consuming and difficult to make all of the connections during assembly. It is also difficult and time consuming to disassemble the entire assembly to check connections, as may be necessary when a poorly soldered grounding connection is formed on a first layer. It is, accordingly, desirable to avoid the need for soldered grounding connections in an electrical enclosure.

SUMMARY OF THE INVENTION

According to one aspect of the present invention, an electrical enclosure for a circuit board is provided. The electrical enclosure includes a top part, the top part including a top shell having a top wall and a top side wall extending downwardly from and disposed around a periphery of the top wall, the top part further including one or more substantially rigid compression fingers extending downwardly from the top wall and disposed inwardly from the top side wall. The electrical enclosure further includes a bottom part, the bottom part including a bottom shell having a bottom wall and a bottom side wall extending upwardly from and disposed around a periphery of the bottom wall, the bottom part further including one or more shield springs extending upwardly from the bottom wall and disposed inwardly from the bottom side wall. The top part and the bottom part are attachable and detachable such that the top and bottom shells define a chamber, the compression fingers and the shield springs contacting top and bottom surfaces of the circuit board, respectively, to thereby suspend the circuit board in the chamber.

According to another aspect of the present invention, an electrical enclosure is provided. The electrical enclosure includes a wall formed of conductive material, the wall having an opening extending therethrough and a channel on an exterior surface of the wall leading to the opening. The electrical enclosure further includes conductive means for securing a coaxial cable in the channel.

According to still another aspect of the present invention an electrical enclosure is provided. The electrical enclosure includes a wall having an opening extending therethrough. The electrical enclosure further includes a flexible conductive sheet disposed over the opening in the wall, the flexible conductive sheet having an opening therein for receiving an electrical connector.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a side, cross-sectional schematic view of an electrical enclosure according to an embodiment of the present invention;

FIG. 2 is a top perspective view of an electrical enclosure according to an embodiment of the present invention;

FIG. 3 is a bottom perspective view of a top part of the electrical enclosure of FIG. 2;

FIG. 4 is a top perspective view of a bottom part of the electrical enclosure of FIG. 2;

FIG. 5 is a cross-sectional schematic view of a portion of an electrical enclosure according to an embodiment of the present invention through which a coaxial cable extends;

FIG. 6 is a cross-sectional schematic view taken at section 6—6 of FIG. 5; and

FIG. 7 is a cross-sectional schematic view of a portion of an electrical enclosure according to an embodiment of the present invention through which an electrical connector extends.

DETAILED DESCRIPTION OF THE PREFERRED EMBODIMENT

A portion of an electrical enclosure 21 according to an embodiment of the present invention is shown with reference to FIG. 1. The electrical enclosure 21 preferably houses and grounds a PCB 23 and provides EMI shielding for electrical equipment (not shown) mounted thereon in a conventional manner. The PCB 23 preferably has top and bottom surfaces 25 and 27 with top and bottom grounding pads or strips 29 and 31 preferably extending continuously around the peripheries of the top and bottom surfaces, respectively.

As shown with reference to FIG. 2, the electrical enclosure 21 preferably includes a top part 33 and a bottom part 35 that are attachable to and detachable from each other. The top and bottom parts 33 and 35 are preferably made substantially entirely from an electrically conductive material such as steel for absorbing EMI when the parts are attached to each other. If desired, however, the top and bottom parts 33 and 35 may be formed of one or more other materials, such as plastic, coated with conductive coatings such as well known painted or plated coatings.

The top part 33, shown without the bottom part 35 in FIG. 3, preferably includes a top shell 37 having a top wall 39 and a top side wall 41 extending downwardly from and disposed around a periphery of the top wall. With reference to FIGS. 1 and 3, the top part 33 preferably also includes a top stiffener bracket 43 having one or more, preferably a plurality of, compression fingers or tabs 45 extending downwardly from and disposed around a periphery of a top wall 47 of the top stiffener bracket. The compression fingers 45 preferably extend downwardly from the top wall 39 and are disposed inwardly from the top side wall 41.

The top wall 47 of the top stiffener bracket 43 is preferably attached to the top wall 39 of the top shell 37 so that an interior surface of the top stiffener bracket is adjacent an exterior surface of the top wall by an attachment technique that ensures that the top stiffener bracket 43 and the top shell 37 are electrically connected, such as by spot or laser welds or soldering. The compression fingers 45 extend through corresponding openings 49 in the top wall 39 of the top shell 37. The compression fingers 45 are preferably bent downward from the top wall 47 of the top stiffener bracket 43 and form a sufficiently tight fit in the openings 49 to provide a low resistance electrical contact between the top wall 39 and the top stiffener bracket 43, which maintains a good electrical ground for the enclosure and, in addition, provides good EMI shielding. The compression fingers 45 are preferably substantially straight so that there is no significant upward yielding of the compression fingers when an upwardly directed force is applied to the ends 45' of the fingers.

The bottom part 35, shown without the top part in FIG. 4, preferably includes a bottom shell 51 having a bottom wall 53 and a bottom side wall 55 extending upwardly from and disposed around a periphery of the bottom wall. As shown with reference to FIGS. 1 and 4, the bottom part 35 preferably also includes a shield member 57 including a bottom wall 59 and one or more, preferably a plurality of, shield springs 61 extending upwardly from and being disposed around a periphery of the bottom wall of the shield member. The shield springs 61 also preferably extend upwardly from the bottom wall 53 of the bottom shell 51 and are disposed inwardly from the bottom side wall 55.

The shield member 57 is preferably attached to the bottom shell 51 such that an exterior surface of the bottom wall 59 of the shield member faces an interior surface of the bottom wall 53 of the bottom shell 51 by an attachment technique that ensures that the shield member and the bottom shell are electrically connected, such as by spot or laser welds or soldering. The shield springs 61 are preferably bent upwardly from the bottom wall 59 of the shield member. In addition, the shield springs 61 are preferably bent along all or a portion of their length so that a force applied downwardly on a top portion 61' of the shield springs causes the shield springs to yield elastically.

As shown in FIGS. 1–3, the top side wall 41 is preferably formed by a plurality of closely spaced fingers 63 bent downwardly from the top wall 39. Spaces 65 between the fingers 63 are preferably minimized, i.e., approximately 1 mm or less, to minimize the possibility of EMI leakage between the fingers. When the top and bottom parts 33 and 35 are attached together, as shown in FIGS. 1 and 2, the bottom side wall 55 preferably fits tightly inside the top side wall 41 and the top edge 67 of the bottom side wall is preferably even with or above the beginning of the spaces 65 to further minimize EMI leakage.

Selected ones or all of the fingers 63 are preferably provided with openings 69. Lances or protrusions 71 corresponding to the openings 69 are spaced around the exterior of the bottom side wall 55, as shown in FIGS. 1 and 4. The lances or protrusions 71 may, for example, be formed from the bottom side wall 55 as outwardly pressed or punched portions thereof. When the top part 33 is to be attached to the bottom part 35, the bottom side wall 55 is fitted inside of the top side wall 41 and the protrusions 71 cause the fingers 63 on which the openings 69 are formed to bend outwardly until the protrusions are received in the corresponding openings and the top and bottom parts so that the fingers spring back to their normal position and the top and bottom parts are thereby latched together.

As shown in FIG. 1, when the top and bottom parts 33 and 35 are attached together, they define a chamber 73. The compression fingers 45 and the shield springs 61 are sized and located such that, when the PCB 23 is received in the chamber 73, the compression fingers contact the top grounding pad 29 on the top surface 25 of the PCB and the shield springs contact the bottom grounding pad 31 on the bottom surface 27 of the PCB. The substantially rigid compression fingers 45 press against the top grounding pad 29 to force the PCB 23 downwardly against the shield springs 61 which yield sufficiently to avoid damage to the PCB. The compression fingers 45 and the shield springs 61 are, in this manner, in good electrical contact with the top and bottom grounding pads 29 and 31, respectively, and, ground the top and bottom grounding pads to the rest of the enclosure 21. Thus, the enclosure 21 according to the present invention grounds a PCB 23, as well provides as shielding of electrical components mounted thereon, without the necessity for welding grounding connections of the PCB to the enclosure.

It will be appreciated that the foregoing describes only a preferred embodiment of the enclosure 21 and that many variations on this embodiment of the enclosure are contemplated by the present invention. For example, the above-described top stiffener bracket and shield bracket may be attached to the bottom shell and the top shell, respectively, instead of as described above. Moreover, the compression fingers and shield springs need not be parts of a top stiffener bracket and a shield member as described above but, rather, may be independently attached to the top and bottom parts. In addition, attachment arrangements other than the above-described opening 69 and lance 71 arrangement are well known for attaching components together and are suitable for use in connection with the present invention. Such arrangements include, for example, the use of mechanical fasteners such as screws which extend through side walls of the top and bottom parts.

If desired, multiple PCBs may be stacked together in a single enclosure 21 and grounded thereto. For example, grounding pads on surfaces of the PCBs may be electrically connected to each other in any suitable fashion and top and bottom grounding pads on uppermost and lowermost ones of the stack of PCBs may be electrically grounded to the enclosure in the manner described above. Grounding pads on top and bottom surfaces of the individual PCBs may, for example, be electrically connected to each other through the individual PCBs, and the grounding pads may be connected, from PCB to PCB, by electrically conductive rigid or yieldable members.

A jacket 75 of a coaxial cable 77 introduced into the enclosure 21 may be grounded to the outside of the enclosure according to an aspect of the present invention shown with reference to FIGS. 2, 5, and 6. The top wall 39 of the top shell 37 and the top wall 47 of the top stiffener bracket 43 are preferably provided with openings 79 and 81, respectively, which are aligned when the top shell and the top stiffener bracket are attached. An elongated channel or slot 83 is provided in the top wall 47 of the top stiffener bracket 43 and extends to the opening 81. The coaxial cable 75 extends through the openings 79 and 81 and lays in the channel 83. An end of the coaxial cable 75 may be attached to the PCB in a conventional manner, e.g., by stripping the outer jacket 75, the coaxial shield 87, and the dielectric 89 and soldering the conductor 91 to the PCB.

The width of the channel 83 is preferably approximately the same as the diameter of the coaxial cable 75 so that the cable is in tight contact with the walls of the channel. A sheet of flexible conductive material 85, such as a tape, having an adhesive, preferably a conductive adhesive, on one side thereof is applied over the coaxial cable 75 to secure the cable in the channel 83, preferably along substantially the entire length of the channel. The conductive material 85 provides a good shielded enclosure around the coaxial cable 75 and gradually absorbs noise on the cable. The conductive adhesive is preferably of the type that can be applied and removed many times to facilitate connecting and disconnecting the cable from the enclosure 21. It will be appreciated that an opening and channel arrangement similar to that described above may be provided in the bottom part 35 or an appropriately constructed side wall instead of, or in addition to, the arrangement described above in the top part 33.

An electrical connector 93 may be introduced into the enclosure 21 while still providing good EMI shielding according to an aspect of the invention shown with reference to FIGS. 2 and 7. The top wall 39 of the top shell 37 and the top wall 47 of the top stiffener bracket 43 are preferably provided with openings 95 and 97, respectively, which are aligned when the top shell and the top stiffener bracket are attached. The opening 95 in the top wall 39 of the top shell is preferably smaller on all sides than the opening 97 in the top wall 47 of the top stiffener bracket 43 so that a portion 99 of the exterior surface of the top wall of the top shell is exposed all around the opening in the top wall of the top stiffener bracket.

A sheet of a flexible conductive material 101, such as a woven conductive fabric, having a conductive adhesive on at least the edges thereof is attached over the portion 99 of the exterior surface of the top wall 39 of the top shell 37. The material 101 preferably has a rectangular hole 103 for receiving a rectangular connector 93, although the shape of the hole may, of course, be varied to accommodate other connector shapes. Slits or bias cuts 105 are preferably provided in the material 101 at corners of the hole 103 for ensuring that, when the connector 93 extends through the hole, the material 101 does not tear. Because the material 101 is flexible, it conforms to the shape of the connector 93 and provides good shielding.

If desired or necessary, the openings 95 and 97 may be substantially the same size and the material 101 may be adhered directly to the inside or the outside surfaces of the top shell 33. The material 101 may further be positioned between the top walls 39 and 47. A similar arrangement may be provided in the bottom part 35 or in appropriately sized side walls in addition to, or instead of, the arrangement described above with regard to the top part.

It is, of course, possible to embody the present invention in specific forms other than those described above without departing from the spirit of the present invention. The embodiments shown are merely illustrative and should not be considered to be restrictive in any way. The scope of the present invention is given in the appended claims, rather than in the preceding description, and all variations and equivalents which fall within the range of the claims are intended to be embraced therein.

What is claimed is:

1. An electrical enclosure for a circuit board, comprising:

a top part, the top part including a top shell having a top wall and a top side wall extending downwardly from and disposed around a periphery of the top wall, the top part further including one or more substantially rigid compression fingers extending downwardly from the top wall and disposed inwardly from the top side wall;

a bottom part, the bottom part including a bottom shell having a bottom wall and a bottom side wall extending upwardly from and disposed around a periphery of the bottom wall, the bottom part further including one or more shield springs extending upwardly from the bottom wall and disposed inwardly from the bottom side wall; and the top part and the bottom part being attachable and detachable such that the top and bottom shells define a chamber, the compression fingers and the shield springs contacting top and bottom surfaces of the circuit board, respectively, to thereby suspend the circuit board in the chamber.

2. The electrical enclosure as set forth in claim 1, wherein the top part further includes a top stiffener bracket, the compression fingers extending downwardly from and being disposed around a periphery of the top stiffener bracket, a top wall of the top stiffener bracket being fixed to an exterior surface of the top wall of the top shell, the compression fingers extending through openings in the top wall of the top shell.

3. The electrical enclosure as set forth in claim 2, wherein the top walls of the top stiffener bracket and the top shell each include an opening, the openings being aligned, the top wall of the top stiffener bracket further including an elongated channel leading to the opening in the top wall of the top stiffener bracket, the electrical enclosure further comprising conductive means for securing a coaxial cable in the elongated channel.

4. The electrical enclosure as set forth in claim 3, wherein the conductive securing means includes a flexible conductive sheet having a conductive adhesive material on one face thereof for securing the flexible conductive sheet over the coaxial cable in the elongated channel.

5. The electrical enclosure as set forth in claim 2, wherein the top walls of the top stiffener bracket and the top shell each include an opening, the openings being aligned, a flexible conductive sheet being disposed over the aligned openings, the flexible conductive sheet having an opening therein for receiving an electrical connector.

6. The electrical enclosure as set forth in claim 1, wherein the bottom part further includes a shield member, the shield springs extending upwardly from and being disposed around a periphery of the shield member, a bottom wall of the shield member being fixed to an interior surface of the bottom wall of the bottom shell.

7. The electrical enclosure as set forth in claim 6, wherein the bottom walls of the top shield member and the bottom shell each include an opening, the openings being aligned, the bottom wall of the bottom shell further including an elongated channel leading to the opening in the bottom wall of the bottom shell, the electrical enclosure further comprising conductive means for securing a coaxial cable in the elongated channel.

8. The electrical enclosure as set forth in claim 7, wherein the conductive securing means includes a flexible conductive sheet having a conductive adhesive material on one face thereof for securing the flexible conductive sheet over the coaxial cable in the elongated channel.

9. The electrical enclosure as set forth in claim 7, wherein the bottom walls of the shield member and the bottom shell each include an opening, the openings being aligned, a flexible conductive sheet being disposed over the aligned openings, the flexible conductive sheet having an opening therein for receiving an electrical connector.

10. The electrical enclosure as set forth in claim 1, wherein the top side wall includes a plurality of elastically bendable tabs, the bottom side wall fitting inside of the top side wall, the top and bottom side walls including inter-engageable attachment members for attaching the top part and the bottom part together.

11. The electrical enclosure as set forth in claim 10, wherein the inter-engageable attachment members include openings in at least selected ones of the tabs, and corresponding protrusions on the bottom side wall, the protrusions being received in the openings.

12. The electrical enclosure as set forth in claim 1, wherein the bottom side wall includes a plurality of elastically bendable tabs, the top side wall fitting inside of the bottom side wall, the top and bottom side walls including inter-engageable attachment members for attaching the top part and the bottom part together.

13. The electrical enclosure as set forth in claim 12, wherein the inter-engageable attachment members include openings in at least selected ones of the tabs, and corresponding protrusions on the top side wall, the protrusions being received in the openings.

14. The electrical enclosure as set forth in claim 1, further comprising an elongated channel on an exterior surface of at least one of the top part and the bottom part, the elongated channel leading to an opening extending through the one of the top part and the bottom part, the electrical enclosure further comprising conductive means for securing a coaxial cable in the elongated channel.

15. The electrical enclosure as set forth in claim 1, further comprising an opening extending through a wall of at least one of the top part and the bottom part, a flexible conductive sheet being disposed over the opening, the flexible conductive sheet having an opening therein for receiving an electrical connector.

16. The electrical enclosure as set forth in claim 1, wherein the circuit board has top and bottom grounding strips extending around edges of the top and bottom surfaces of the circuit board, the compression fingers and the shield springs contacting the top and bottom grounding strips, respectively, the compression fingers and the shield springs being conductive to ground the top and bottom grounding strips, respectively.

17. An electrical enclosure, comprising:

a wall formed of conductive material, the wall having an opening extending therethrough and a channel on an exterior surface of the wall leading to the opening;

conductive means for securing a coaxial cable in the channel, wherein the conductive securing means includes a flexible conductive sheet having a conductive adhesive material on one face thereof for securing the flexible conductive sheet over the coaxial cable in the channel.

18. The electrical enclosure as set forth in claim 17, wherein the wall includes an inner and an outer wall formed of conductive material, the channel being in the form of an elongated slot provided in the outer wall.

19. The electrical enclosure as set forth in claim 18, further comprising a second opening extending through the wall, a flexible conductive sheet being disposed over the second opening between the inner and outer walls, the flexible conductive sheet having an opening therein for receiving an electrical connector.

20. The electrical enclosure as set forth in claim 17, further comprising a second opening extending through the wall, a flexible conductive sheet being disposed over the second opening, the flexible conductive sheet having an opening therein for receiving an electrical connector.

21. An electrical enclosure, comprising:

a wall having an opening extending therethrough; and a flexible conductive sheet disposed over the opening in the wall, the flexible conductive sheet having an opening therein for receiving an electrical connector, wherein the wall includes an inner wall and an outer wall.

22. The electrical enclosure as set forth in claim 21, wherein the opening in the flexible conductive sheet is substantially rectangular.

23. The electrical enclosure as set forth in claim 22, wherein bias cuts are provided in the flexible conductive sheet at corners of the rectangular opening.

24. The electrical enclosure as set forth in claim 21, wherein the flexible conductive sheet is secured over the opening in the wall by a conductive adhesive.

25. The electrical enclosure as set forth in claim 21, wherein the flexible conductive sheet is attached to a surface of the inner wall.

26. The electrical enclosure as set forth in claim 21, wherein the wall is formed of conductive material and has a second opening extending therethrough and a channel on an exterior surface of the wall leading to the second opening, the electrical enclosure further comprising conductive means for securing a coaxial cable in the channel.

* * * * *